(12) United States Patent
Zentai

(10) Patent No.: US 7,355,385 B2
(45) Date of Patent: Apr. 8, 2008

(54) VOLTAGE INJECTOR AND DETECTOR USING PIXEL ARRAY FOR PRINTED CIRCUIT BOARD TESTING

(75) Inventor: George Zentai, Mountain View, CA (US)

(73) Assignee: Varian Medical Systems Technologies, Inc., Palo Alto, CA (US)

( * ) Notice: Subject to any disclaimer, the term of this patent is extended or adjusted under 35 U.S.C. 154(b) by 65 days.

(21) Appl. No.: 11/192,849

(22) Filed: Jul. 28, 2005

(65) Prior Publication Data

US 2007/0024272 A1 Feb. 1, 2007

(51) Int. Cl.
*G01R 31/26* (2006.01)
*G01R 31/02* (2006.01)

(52) U.S. Cl. .................. 324/158.1; 324/765; 324/750; 324/537

(58) Field of Classification Search .................. None
See application file for complete search history.

(56) References Cited

U.S. PATENT DOCUMENTS

| | | | |
|---|---|---|---|
| 5,177,437 A * | 1/1993 | Henley | 324/754 |
| 5,325,442 A | 6/1994 | Knapp | |
| 5,343,061 A * | 8/1994 | Yamashita et al. | 257/229 |
| 5,550,659 A * | 8/1996 | Fujieda et al. | 349/12 |
| 5,999,012 A * | 12/1999 | Listwan | 324/770 |
| 6,323,846 B1 * | 11/2001 | Westerman et al. | 345/173 |
| 6,483,931 B2 | 11/2002 | Kalnitsky et al. | |
| 6,614,053 B1 | 9/2003 | Takenaka | |
| 6,921,892 B2 * | 7/2005 | Colbeth et al. | 250/214.1 |
| 7,022,287 B2 * | 4/2006 | Schoeniger et al. | 422/82.01 |
| 7,053,352 B2 * | 5/2006 | Schauerte et al. | 250/208.1 |
| 2001/0050728 A1 | 12/2001 | Edwards | |
| 2002/0131011 A1 | 9/2002 | Izumi | |
| 2004/0223065 A1 * | 11/2004 | Takayanagi | 348/295 |
| 2005/0184218 A1 * | 8/2005 | Schauerte et al. | 250/208.1 |
| 2005/0285509 A1 * | 12/2005 | Funamoto et al. | 313/504 |
| 2006/0044298 A1 * | 3/2006 | Mignard et al. | 345/205 |

OTHER PUBLICATIONS

"A CdSe-CdTe Thin-Film Transistor" by Tung H. Weng, IEEE Oct. 1969 (two pp. 1780-1781).*

* cited by examiner

*Primary Examiner*—Paresh Patel
(74) *Attorney, Agent, or Firm*—Blakely, Sokoloff, Taylor & Zafman LLP

(57) ABSTRACT

One embodiment includes an injector pixel array having injector pixels each coupled to the bottom surface of a conductive material having a directional electrical conductivity only in a direction corresponding to a path between the bottom surface and top surface of the conductive material. Each injector pixel includes a semiconductor based switch coupled to a charge or voltage driver to inject a charge or voltage into each injector pixel. Embodiments, also include a detector pixel array having detector pixels each coupled to the bottom surface of the directionally conductive material. Each detector pixel includes a semiconductor based switch coupled to a charge or voltage storage capacitor to detect a charge or voltage at each detector pixel.

21 Claims, 5 Drawing Sheets

US 7,355,385 B2

VOLTAGE INJECTOR AND DETECTOR USING PIXEL ARRAY FOR PRINTED CIRCUIT BOARD TESTING

TECHNICAL FIELD

Embodiments of the invention relate to the field of introducing a charge or voltage into a trace of a printed circuit board through an insulator material or a directionally conductive material, and detecting the introduced charge or voltage, such as to test the layout of a trace on a printed circuit board.

BACKGROUND

A printed circuit board ("PCB") is a thin plate on which integrated circuits and other electronic components (e.g., discrete) are mounted. For example, computers typically include one or more PCBs such as motherboards, controller cards, and network interface cards ("NIC"). Once a PCB has been manufactured, it undergoes testing, including a continuity test to ensure that no opens or shorts exist on the conductive trace routes. PCBs can be quite large, containing intricate patterns (e.g., "layouts") of hundreds of traces. Many high-density printed circuit products have been developed for High Density Interconnects ("HDI") applications. Examples of HDI applications include integrated circuit packaging, hard disk drives, mobile phones, and flat panel displays. These applications require high-density circuits having fine lines smaller than 50-micron lines and spaces, and tight contact pads, which have a pitch smaller than 100 microns. However, the production of high-density circuits and other PCBs are not reliable, requiring electrical continuity tests to be performed on various trace routes of the circuit board.

One method for testing the continuity of a trace routes on circuit boards includes optically inspecting each trace for opens or shorts using, for example, automatic optical inspection ("AOI"). However, optical methods have not proved as reliable as physically testing the electrical connection of each circuit. Another method includes electrically testing the continuity of each trace. Electrical open/short tests (e.g., by introducing a charge or voltage to a location of a trace and detecting the introduced charge or voltage at other locations of the trace), which provide more reliable results than optical testing, have limitations of their own. Current electrical test equipment uses contact pin probes, but these probes have physical limitations in the pitch size of the probes. Typically, 0.3 mm pitch probes may be the lowest or best size resolution or spacing limit for testing a single pad line and 0.2 mm pitch probe arrays for dual line pads. In addition, the contact pin probes may cause mechanical damage and stains to the circuit during testing. In addition, high pressure may be required to make exact electrical contact on each pad of high-density circuits. As such, the probes may cause dents on a small pad which requires a uniform surface to make a reliable connection and which is fragile against mechanical force, especially for flying leads of flex circuits.

Charge coupled device ("CCD") imagers have been used for testing the continuity of traces on a PCB. These imagers allow trace routes to be visually inspected. However, CCD imagers are severely restricted in their size (because of the limitations of producing large-scale wafers); thereby making them impractical for testing of large size PCBs.

SUMMARY

One embodiment includes an injector pixel array having injector pixels each coupled to the bottom surface of a conductive material having a directional electrical conductivity only in a direction corresponding to a path between the bottom surface and top surface of the conductive material. Each injector pixel includes a semiconductor based switch coupled to a charge or voltage driver to inject a charge or voltage into each injector pixel.

BRIEF DESCRIPTION OF THE DRAWINGS

Embodiments of the present invention are illustrated by way of example, and not limitation, in the Figures of the accompanying drawings in which.

DETAILED DESCRIPTION

Figure 1:
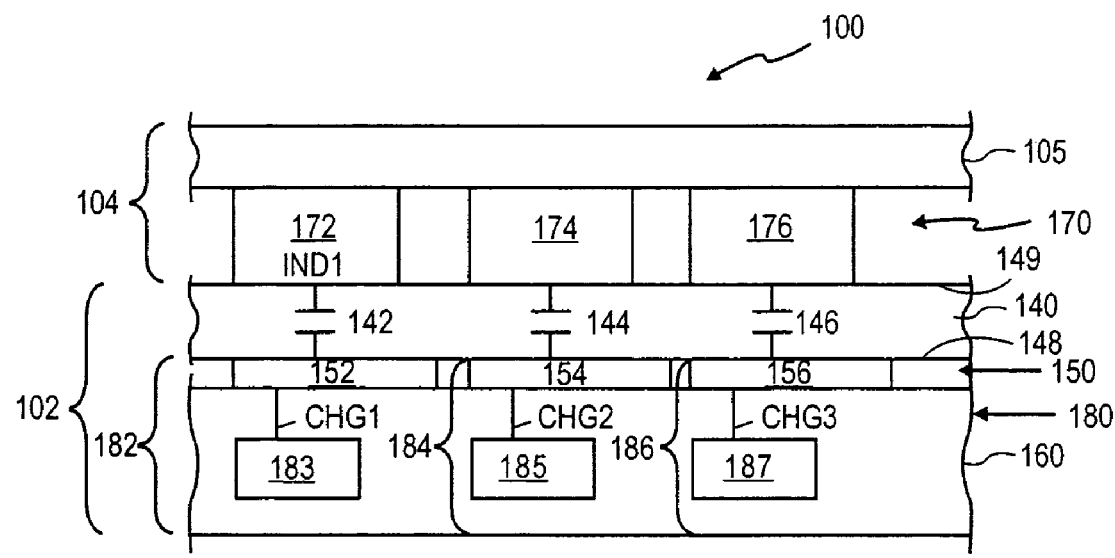
FIG. 1 illustrates a cross-section of an embodiment of an inductor tester coupled to traces of a printed circuit board (PCB).

In the following description, numerous specific details are set forth such as examples of specific, components, processes, etc. in order to provide a thorough understanding of various embodiments of the present invention. It will be apparent, however, to one skilled in the art that these specific details need not be employed to practice various embodiments of the present invention. In other instances, well known components or methods have not been described in detail in order to avoid unnecessarily obscuring various embodiments of the present invention.

A system and method for testing conductive traces on a circuit board are described. The testing of conductive traces on a circuit board may include testing for electrical continuity, opens, and shorts on particular trace routes. In one embodiment, a semiconductor based (e.g., flat panel) imaging tester may be used. For example, a semiconductor based tester may be capacitively coupled and/or coupled by a directionally-conductive material to conductive traces of a PCB. In various embodiments, "semiconductor based" (e.g., such as referring to a pixel, array, device, transistor, capacitor, driver, switch, read out, tester, etc.) may be silicon based, amorphous silicon ("a-Si") based, polycrystalline silicon ("p-Si") based, thin film transistor ("TFT") based, complementary metal oxide semiconductor (CMOS) based, metal oxide field effect semiconductors (MOSFETS) based, organic semiconductor based, glass or comparable material based, ceramic based, flexible material based, plastic based, Kapton® based, Mylar® based (made by DuPont of Wilmington, Del.), organic semiconductor based, and/or a semiconductor substrate materials for supporting passive and active electronic devices. Moreover, such passive and active electronic devices that may be included in semiconductor based technologies described herein include capacitors, electrodes, resistors, inductors, amplifiers, drivers, driver amplifiers, pulse generators, transistors, switches, injector, circuits, read-out circuits, detectors, combined injector and detector pixels, gatelines, controllers, interconnects, and other electronic devices and circuitry as appropriate to be part of or to support the devices described herein. According to some embodiments, CMOS technology can provide all of the necessary passive and active electronic devices (switches, capacitors, drivers, read out circuits, electrodes, etc. integrated in one substrate, such as a silicon substrate). Such a CMOS circuits may be sized to the size of the single crystal silicon wafer size, which can be 12" in diameter at present but might be larger later on. Also, according to some embodiments, an insulator substrate TFT (a-Si, p-Si and organic TFT) technology can provide all of the necessary passive and active electronic devices. Such a TFT circuit may be unlimited in size (e.g., using a single crystal silicon technology 32 to 42 inch size liquid crystal display (LCD) devices may be fabricated that contain TFT transistors).

For instance, a semiconductor based tester may be a flat panel imager having pixels with storage capacitors and/or injectors (charge or voltage) coupled to an insulating or directionally conductive material. The charge or voltage detected by the tester when a charge or voltage is introduced to a trace route enables the trace route to be generated as an image. In one embodiment, the trace route may be compared with a known, expected trace route.

The descriptions for the Figures referenced below may be discussed with respect to a-Si based, flat panel testers. It may be appreciated by one of skill in the art, however, that other types of flat panel testers may be used, including but not limited to semiconductor based, silicon based, polycrystalline silicon ("p-Si") based, complementary metal oxide semiconductor (CMOS) based, metal oxide field effect semiconductors (MOSFETS) based, and/or organic semiconductor based testers.

The terms "top," "bottom," "front," "back," "above," "below," and "between" as used herein refer to a relative position of one layer, material, surface, trace, or component with respect to another. As such, one layer material, trace, or surface deposited or disposed above, over, between, or below another layer or layers, may be directly in contact with, touching, coupled to and/or electrically coupled to the other layer(s) or may have one or more intervening layers. The term "coupled" as used herein means connected directly to, touching, electrically connected (e.g., having substantially a very low resistance or impedance there between) or connected indirectly through one or more intervening layers or operatively electrically coupled through circuitry (e.g., such as a switch).

FIG. 1 illustrates a cross-section of an embodiment of an inductor tester coupled to traces of a printed circuit board (PCB). In this embodiment, arrangement 100 is shown, including printed circuit board (PCB) 104 having PCB insulator 105 and PCB metal traces 170 coupled to insulator material 140. In turn, material 140 is coupled to electrodes of array 150, which is coupled to substrate 160.

PCB 104 may be a circuit board or printed circuit board having electrically conductive traces 170 as known in the art, such as traces for electrically connecting electronic devices (e.g., capacitors, inductors, resistors, transistors, etc.). Specifically, FIG. 1 shows traces 170 including trace 172, 174 and 176 formed on or attached to insulator 105 (e.g., to form a circuit board or a PCB having conductive traces). Specifically, insulator 105 may be an electrical insulator separating electrically conductive traces 172, 174, and 176 from each other. Traces 172, 174, and 176 may be any type of material capable of conducting electric current and/or pulses (e.g., such as a conductor or semiconductor).

Substrate 160 may be a glass or comparable material known in the art such as ceramic and flexible materials, such as plastic, semiconductor material, Kapton®, Mylar® made by DuPont of Wilmington, Del., and/or other plastic based materials, etc. Also, substrate 106 may include a semiconductor material, silicon material, amorphous silicon ("a-Si"), polycrystalline silicon ("p-Si"), an organic semiconductor, or various other appropriate silicon or semiconductor substrates, glass, ceramic, or plastic substrates for supporting semiconductor based devices. Specifically, substrate 160 and devices formed thereon as described herein may include an "a-Si" pixel array which may be the basis for a semiconductor based array or application specific integrated circuit (ASIC) array of injector, detector, and/or combined injector and detector pixels, gatelines, switches, controllers, drivers, transistors, resistors, inductors, capacitors, readout circuits, interconnects, and other devices and structures as appropriate to be part of or to support the devices described herein. In some cases, substrate 160 may include a small p-Si semiconductor based array, such as an array available for a liquid crystal display (LCD).

In addition, electrodes of array 150 are shown, including electrodes 152, 154, and 156, which may be part of an array or grid or electrodes for testing traces 170. Array 150 may be part of or coupled to a semiconductor based (e.g., a silicon based thin film transistor (TFT)) tester for testing traces 170. More specifically, tester 102 is shown in FIG. 1, including insulator material 140 coupled to electrode 152, 154, and 156 of electrode electrodes of array 150. Electrodes 152, 154, and 156 are each part of injector pixels 182, 184, and 186, respectively, of injector pixel array 180. Thus pixels of array 180 may be described as circuits. Insulator material 140 may be electrically coupled, attached, connected, and/or adhered to electrodes of electrodes of array 150. Representatively, material 140 is shown coupled to electrode 152, which is in turn coupled to injector 183. Electrode 152 and injector 183 form injector pixel 182. Injector pixel 184 and 186 may correspond in structure to pixel 182, as shown in FIG. 1, such as by including injectors 185 and 187, respectively. Since, the components of pixel array 180 may be a semiconductor based (e.g., such as a-Si, p-Si or organic TFT) technology, a tester of this type may also be referred to as a semiconductor based flat panel tester.

Material 140 may be coupled to traces 170, such as by being electrically coupled, removable attached (e.g., removably attached), in contact with, touching, or otherwise able to provide capacitive coupling between electrodes of array 150 and traces 170 (e.g., such as to introduce or induce a charge into traces 170 resulting from a charge injected into electrodes of array 150). For example, FIG. 1 shows material 140 introducing capacitance 142, 144, and 146 between surfaces 148 (e.g., a bottom or second surface) and 149 (e.g., a top or first surface) between electrodes 152 and traces 172, electrode 154 and trace 174, and electrode 156 and trace 176, respectively. Capacitances 142-146 may be representative of dielectric characteristic and thickness of material 140. For example, capacitances 142, 144, and/or 146 may have a value of 0.006 pico-farads (pF), or various other values as appropriate for inducing the charge injected into the corresponding electrodes to the appropriate trace or traces of 170. Specifically, any of capacitances 142-146 are determined by the permittivity and thickness of insulator material 140 and the geometry of electrodes 150 in relative to traces 170.

According to some embodiments, injector 183; and pixels 180, 182, 184, and 186 may be used to inject or induce a charge (e.g., inject a selected charge into electrodes of array 150 to be capacitively coupled to induce a charge in traces 170), inject a pulse voltage (e.g., inject a voltage that quickly ramps to a peak and dies off into traces 170 through a conductor electrically coupled between the traces and electrodes of array 150) (See FIGS. 3-6), or inject a direct current voltage (e.g., inject a constant level voltage for a period of time into traces 170 (e.g., a period sufficient to allow for detection from traces 170) through a conductor electrically coupled between the traces and electrodes of array 150) (See FIGS. 3-6).

In order to test the continuity of a conductive trace, the trace (e.g., trace 172) may be pressed against (e.g., touching) material 140 on one side, with the other side of material 140 in contact with (e.g., touching) a pixel array of injector and/or detector pixels as described herein. For example, by capacitive coupling the traces 172, 174, 176 with pixels 182, 184, 186 of tester 102 as illustrated in FIG. 1, a particular trace route or layout may be detected by measuring the charge on a pixel of the tester. In the configuration illustrated in FIG. 1, conductive trace 172 is capacitive coupled to pixel 182. By applying a voltage to electrode 152, an electrical charge develops between conductive trace 172 and electrode 152 (i.e., conductive trace and pixel serve as the opposing electrodes of a capacitor formed with material 140 insulator). Trace 172 is shown having induced charge IND1, representative of a charge that may be induced in the trace via capacitance 142 by applying a voltage or injecting charge CHG1 to electrode 152. For instance, a charge injected into an electrode coupled to a conductor may not generate a voltage (e.g., the charge is electrically shorted away by the conductor), but a charge injected into an electrode of a capacitor can generate a voltage (e.g., between the two electrodes of the capacitor) equal to the charge divided by the capacitance value (V=Q/C). In some embodiments, injector 183 injects 50 volts (e.g., 50V) to electrode 152, inducing 3(milli-volts)mV of electricity at inducted charge IND1 of trace 172.

It can be appreciated that a corresponding capacitance exists between trace 172 and electrode 152 when a voltage is applied at trace 172, thus developing an electrical charge induced from conductor trace 172 and to electrode 152, as will be explained further below with respect to FIG. 2A.

Material 140 may be any number of materials known in the art to electrically separate conductive trace 172 from electrode 152. Material 140 may be silicon, hardened epoxy material, other electrically insulating material. In one embodiment, material 140 may be a polyamide film such as Kapton®. Alternatively, insulator may be Mylar®. Under some circumstances and depending on the environmental conditions, thin film transistors of pixels 183 185 and 187 may be exposed to light that may interfere with the insulating properties of these transistors of pixel array 180 when they are in OFF state. As such, in one embodiment, a light blocking insulator layer (not shown) may be disposed on substrate 160.

In another embodiment, material 140 may include several layers of different material. In one exemplary embodiment, a bottom layer may be Kapton® with a top layer of Mylar®. The Mylar® layer could be replaced over time if damaged from repeated contact with different circuit boards. Bottom layer can also have a permanent layer of black matrix for light shielding. In addition to providing a separation between conductive traces 170 and pixels, material 140 provides a mechanical, protective layer for conductive traces 170 and pixel array 180. Because conductive traces 170 (alone or as part of a PCB) are physically pressed against material 140, a thick insulator may prevent damage to conductive traces 170. However, a balance between providing adequate protection to conductive traces 170 and achieving the desired sensitivity level of electrodes of array 150 should be taken into consideration because the thicker the insulator, the smaller the value of the coupling capacitance through the insulator layer resulting in a smaller charge detected; in comparison to the noise signal (S/N ratio decreases). Material 140 may have a thickness between the top and bottom surface of between 10 micrometers and 1000 micrometers in thickness. Moreover, the thickness and material 140 may depend on the desired capacitance between traces 170 and electrodes of array 150 or 250 (e.g., see FIG. 2A).

It is considered that pixel array 180 may include a-Si device and/or semiconductor based devices, such as an array or grid of capacitors, electrodes, resistors, inductors, amplifiers, drivers, driver amplifiers, pulse generators, transistors, switches, injector, circuits, read-out circuits, and other electronic devices and circuitry, as known in the art. For example, injector 183, representatively, may include a charge or voltage injector such as an injector circuit, a pulse generator, a driver, a driver amplifier, and/or an active device to provide voltage or electrical charge CHG1 to electrode 152. The voltage generated by charge CHG1 may be in a range of 0.1 to 100 volts, such as 0.5, 1, 2, 4, 8, 10, 20, a combination thereof, or any number of volts (V) in voltage.

Figure 2A:
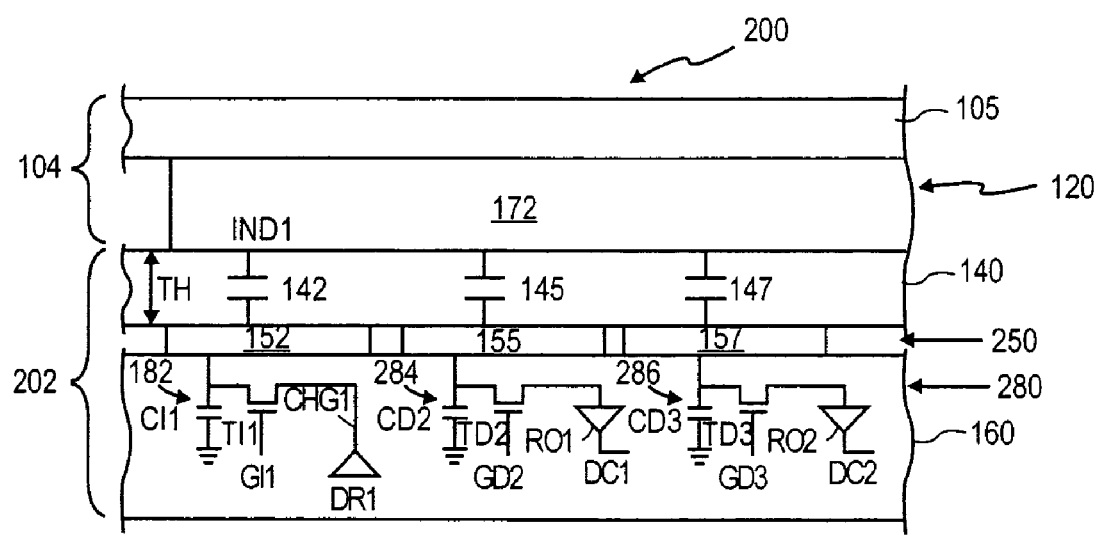
FIG. 2A illustrates a cross-section of an embodiment of an inductor/detector tester coupled to traces of a PCB.

FIG. 2A illustrates arrangement 200 that includes a cross-section of an embodiment of an inductor/detector tester 202 coupled to trace 172 of PCB 104. FIG. 2A shows detector pixel array 280, including injector pixel 182, detector pixel 284, and detector pixel 286. For instance, inductor/detector tester 202 may be defined as material 140 coupled to electrode 152, 155, and 157 of electrode array 250 of pixels 182, 284 and 286 of pixel array 280, in substrate 160. Thus pixels of array 280 may be described as circuits. Pixel array 280 may include semiconductor based devices such as described above with respect to pixel array 180.

Trace 172 is coupled to material 140 having capacitances 142, 145 and 147 between electrode 152, 155, and 157 of electrode array 250, respectively. Electrodes 155 and 157 may be electrodes similar to those described herein for electrode 152. Likewise, electrode array 250 may be an array of electrodes as described for electrodes of array 150. Capacitances 145 and 147 may be capacitances similar to those described for capacitance 142 at FIG. 1.

In FIG. 2A, injector pixel 182 is shown, including electrode 152 and pixel capacitor CI1 (which may be a semiconductor based, such as a TFT or CMOS, capacitor) coupled between electrode 152 and ground. Pixel 182 also includes a semiconductor based, such as a TFT or CMOS, switch TI1 coupled between electrode 152 and voltage or charge driver DR1 (e.g., also see explanation below for FIG. 7), and having its gate coupled to gate line GI1. Capacitor CI1 may be an actual capacitor and/or a capacitance inherent in the electronic characteristics of injector 183, stray capacitances of arrangement 200 (as well arrangement 300, 500, 600, or 700, as described below), capacitive coupling of arrangement 200 (as well arrangement 300, 500, 600, or 700, as described below), and/or loading effect of arrangement 200 (as well arrangement 300, 500, 600, or 700, as described below). Driver DR1 may output voltage or charge CHG1, to be switched by a switch TI1 to electrode 152 when gate line GI1 activates switch TI1. Thus, in the embodiment of FIG. 2A, capacitor CI1, switch TI1, gate line GI1, and driver DR1 may represent the structure of injector 183.

Similarly, FIG. 2A shows detector pixel 284, including electrode 155 and pixel capacitor CD2 (which may be a semiconductor based, such as a TFT or CMOS, capacitor) coupled between electrode 155 and ground. Pixel 284 also includes a semiconductor based, such as a TFT or CMOS, switch TD2 coupled between electrode 155 and readout circuit RO1, where switch TD2 has its gate coupled to gate line GD2. Readout circuit RO1 outputs detected charge DC1 from capacitor CD2 when switched TD2 is activated by gate line GD2. Detector pixel 286 has a corresponding and similar configuration to that described above with respect to detector pixel 284.

Detector pixels 284 and 286 may detect, readout, sense, capture, store, and switch detected charges induced in electrodes 155 and 157 via capacitances 145 and 147 from trace 172, according to the same concepts described above with respect to capacitance 142 of FIG. 1. For example, a voltage or a charge in trace 172 may induce a capacitance in electrodes 155 and/or 157 according to capacitances 145 and 147, respectively. Thus, the charges induced in electrodes 155 and 157 may be captured in capacitors CD2 and CD3 to be switched to readout circuits RO1 and RO2 by switches TD2 and TD3. Thus, a charge may be injected into electrode 152 inducing charge IND1 in trace 172 which is in turn induce charges into electrodes 155 and 157 and switched to readout circuits RO1 and RO2 for detection as detected charges DC1 and DC2. If the expected result is to detect a charge indicating conductance along trace 172 from electrode 152 to electrode 155 and electrode 157, the tester may test to determine whether the charge induced in trace 172 by electrode 152 is detected at electrode 155 and electrode 157. Thus, if the charge is not detected at electrode 155 or electrode 157, the test may fail.

The value of capacitance for capacitors CI1, CD2 and CD3 may be selected, or chosen based on the selection of other components of arrangement 200 (e.g., where the capacitance is not from a capacitor device, but is inherent in the arrangement), depending on the specific design of the tester, to provide proper functionality thereof. Thus, the capacitance of those capacitors may be 0.1, 0.2, 0.4, 0.8, 1.0, 2.0, 4.0, a combination thereof, or any number of pF of capacitance. Similarly, the type, switching speed, voltage drop across the switch, activation gate voltage, etc. of switches TI1, TD2, and TD3 may be various values as appropriate for the desired tester. For example, various line activation voltage values for gate line GI1, GD2, and GD3 to activate the switches may be selected. Next, readout circuitry RO1 and RO2 may be various types of readout circuits, provide various amplification of signal and/or include other electrical characteristics, as desired for the tester. In some cases, readout circuits RO1 and RO2 may include readout circuitry, drivers, amplifiers, driver amplifiers, application specific integrated circuit (ASIC) devices, resistors, inductors, capacitors, transistors, active devices, and/or other electronic devices or circuitry as known in the art. Moreover, those devices may be semiconductor based, such as a TFT or CMOS, devices. Driver DR1 may include driver circuitry, drivers, amplifiers, driver amplifiers, ASIC devices, resistors, inductors, capacitors, transistors, active devices, and/or electronic devices of circuitry as known in the art. Those capacitors, switches, readout circuits, and/or drivers may be semiconductor based (e.g., silicon based, amorphous silicon ("a-Si") based, thin film transistor ("TFT") based, complementary metal oxide semiconductor (CMOS) based, metal oxide field effect semiconductors (MOSFETS) based, and/or organic semiconductor based), such as by being part of a pixilated semiconductor based array or ASIC device. It is also contemplated that injector 183 may include such devices as described above for capacitors CI1, switch TI1, gate line GI1, and/or driver DR1. Moreover, injector 183 may include or exclude a switch (corresponding to switch TI1 of FIG. 2) and/or a capacitor (corresponding to capacitor CI1 of FIG. 2).

Various other configurations of electronic devices for each injector pixel or detector pixel are contemplated, as known in the art. For example, such configurations include embodiments excluding or using other devices in place of capacitors CI1, CD2, and/or CD3; switches TI1, TD2, and/or TD3; driver DR1; and/or readout circuits RO1 and/or RO2 to provide similar functions.

According to some embodiments, detector pixels 280, 284, and 286; and readout circuits RO2 and RO2 may be used to detect a charge (e.g., detect a charge induced or injected into traces 170 that is capacitively coupled to induce a charge in electrodes of array 250), detect a pulse voltage (e.g., detect a voltage that quickly ramps to a peak and dies off from traces 170 through a conductor electrically coupled between the traces and electrodes of array 250) (See FIGS. 3-6), or detect a direct current voltage (e.g., detect a constant level voltage for a period of time from traces 170 (e.g., a constant voltage level injected into traces 170 for a period sufficient to allow for detection) through a conductor electrically coupled between the traces and electrodes of array 250) (See FIGS. 3-6).

Figure 2B:
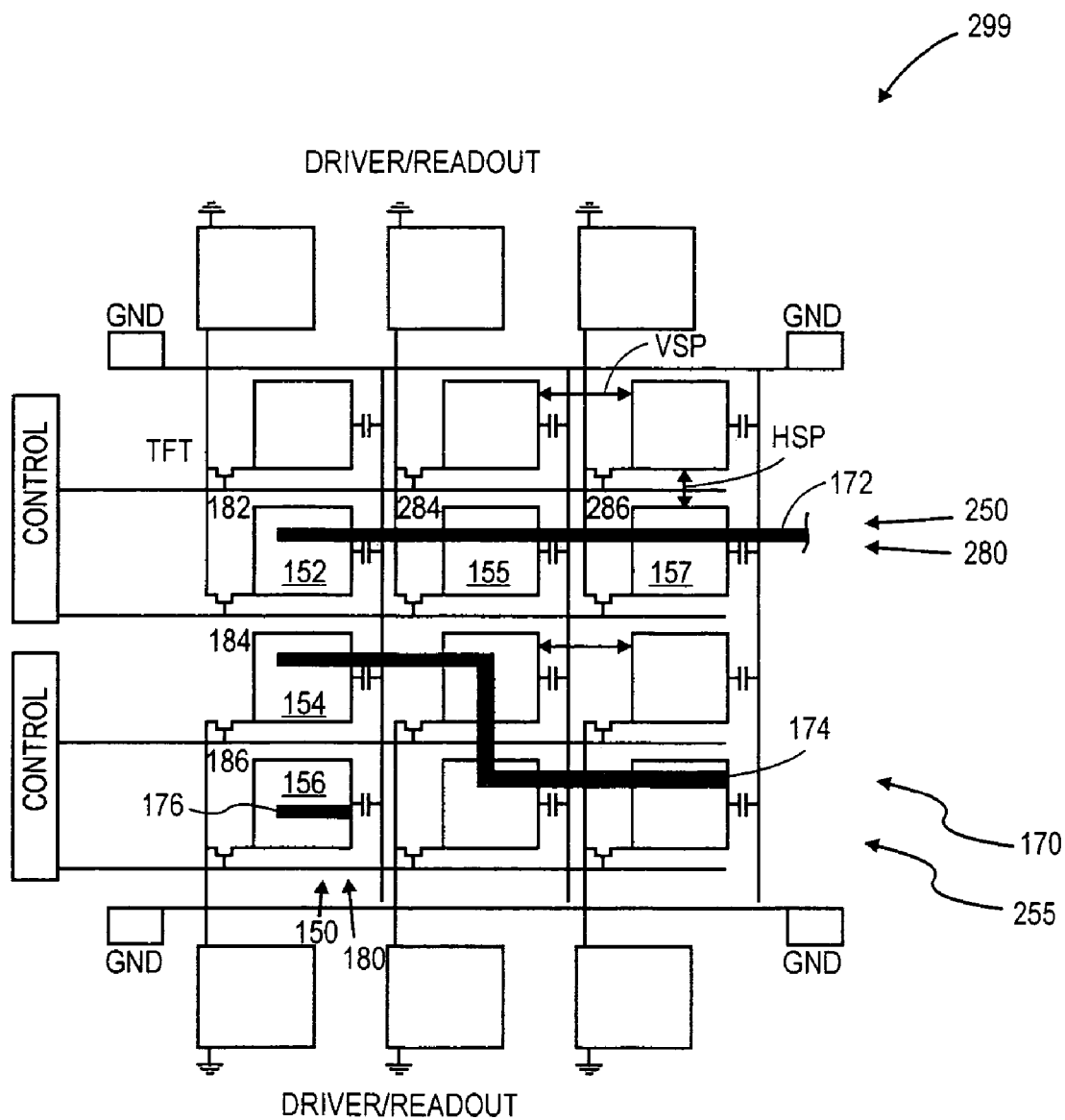
FIG. 2B illustrates an embodiment of an inductor/detector tester coupled to traces of a PCB from a top perspective view.

FIG. 2B illustrates an embodiment combining the embodiments of FIGS. 1 and 2A, from a top perspective view. FIG. 2B shows arrangement 299 showing conductive (e.g., made of or including a metal or other conductive material) traces where a side view of trace 172 of traces 170 on or coupled to, (such as by touching) insulator material 140, wherein a side view of tracer 172 above or disposed over electrode 152, 155, and 157, is shown in FIG. 2A. Likewise, FIG. 2B shows arrangement 299 having conductive (e.g., made of or including a metal or other conductive material) traces 172, 174, and 176 on or coupled to (such as by touching) material 140 above or disposed over electrode 152, 154, and 156 (where a side view is shown in FIG. 1). The combination of electrodes of electrodes of array 150 and 250, as well as the other electrodes shown in FIG. 2B forms electrode array 255. Substrate 160, pixel array 180, pixel array 280 and/or array 255 may include a poly-silicon thin film transistor array, an ASIC, an integrated glass array, or another array on a substrate (such as a semiconductor based or other array) capable of providing signals to an image processing unit.

Material 140 may couple traces 172, 174, and 176 to electrodes of electrodes of array 150 and 250 of array 255 as shown in FIGS. 1, 2A and 2B. For example, as noted above with respect to FIG. 2A, a charge may be injected into electrode 152, inducing a charge into trace 172, which is in turn induced into electrodes 155 and 157 for detection. If the expected result is to detect a charge indicating conductance long trace 172 between a location of trace 172 at or above electrode 152, a location at or above electrode 155, and a location at or above electrode 157, the tester may test to determine such conductance by determining whether the charge induced at trace 172 by electrode 152 is detected at electrode 155 and 157. If the charge is not detected at electrode 155 or electrode 157, the test may fail. A similar concept applies to trace 174 and 176. For example, if a charge injected at electrode 156 induces a charge in trace 176, it may be expected that the charge will not be read at any other pixel. However, if the charge is read at another pixel, it may show improper connectivity (e.g. an electrical signal short) between trace 176 and trace above that other pixel.

FIG. 2B also shows controllers CONTROL, ground connections GND, and injector drivers or readout circuits DRIVER/READOUT coupled to each of the pixels. Each DRIVER/READOUT may represent a driver (e.g., pixel 182 of FIG. 2A) or readout circuit (e.g., pixel 284 of FIG. 2A) or a combination thereof (e.g., pixel 682 of FIG. 6) as described herein. Specifically, to correspond with combining the embodiments of FIGS. 1 and 2A, in FIG. 2B, the DRIVER/READOUTs coupled to pixels 182, 184, and 186 may represent drivers, while the DRIVER/READOUTs coupled to pixels 284 and 286 may represent readout circuits. CONTROL may each represent controls to switches of each pixel, such as control signals sent to activate, control or address gate lines GI1, GD2, and/or GD3 of FIG. 2A. For example, CONTROL may use pulse addressing, an addressing matrix, group addressing, direct trace addressing, DC voltage, or other addressing processes to individual or groups of pixels to inject charges and induce voltage into traces to test traces of a PCB. CONTROL may use similar addressing to detect the changes and voltages in the traces when the charges or voltages are induced or injected from the traces into detector arrays of the same or a different tester.

According to one embodiment, control or addressing of injector pixels, detector pixels, injector and detector pixels (e.g., described below at FIG. 6) may be performed by pulse addressing to pulse inject charges or voltages into electrodes of injection pixels (e.g., referring to FIGS. 2A and 2B, such as by sending a pulse charge or voltage from driver DR1 and switching switch T1 for a period that causes a charge pulse to be sent to electrode 152). Then, once the charge is induced into a trace and induced from the trace into detector pixel(s), the charge in the detector pixel may be read out (e.g., such as by using switch TD2 of FIG. 2A) to read out the captured charge at capacitor CD2 from electrode 155 and discharge (reset) CD2, as shown in FIG. 2A. The charge may be read out by appropriate addressing of detector pixels (such as by switching switch TD2) for a sufficient period and/or activating READOUT circuit (RO1) sufficiently to allow the charge captured at CD2 to provide a signal at DC1.

In some cases, control and/or addressing may be performed for injecting and detecting by one or more ASIC's. For example, a 10×10 ASIC may conveniently address 100 pixels of a tester at 100 locations of one or more traces. The ASIC technology may be less expensive, more durable, and more reliable than attempting to address the same 100 locations of the trace using discrete wires or pins. Moreover, the semiconductor based, and/or ASIC technology described herein may provide LCD like resolution, and allow for a more convenient row column addressing due to the fixed nature and well established addressing capabilities of such technologies (e.g., such as compared to using wires or pins at locations of traces). Moreover, such technologies are much less bulky and require much less power and are much easier to use than wires or pins. In some cases, the ASIC technology may include rows and columns of semiconductor based, such as a TFT or CMOS, pixels to form an array of injection pixels, each pixel having a driver or injector and one or more switches. For example, the gating pulse provided to gate lines GI1, GD2 and/or GD3 may have a voltage greater than the voltage of charge CHG1, or a voltage otherwise selected so that switching of charged CHG1 to electrode 152 does not alter activation or deactivation of switch TI1, TD2, TD3, or any other switch of an injector or detector pixel. A similar concept applies for using a gating pulse having a voltage greater than or selected such that the charge output by a charged driver such as driver DR1 does not activate or deactivate a switch of a pixel. RO1

It is contemplated that some embodiment could use "traditional" pin contact matrix to address traces by applying voltages onto them and using just a readout matrix with a directionally electrically conductive material, coupled between the readout matrix and the traces. Specifically, discrete wires or pins could be used to address traces by applying voltages onto them and a readout matrix (e.g., pixels, such as pixels 150) could be used to detect the applied voltages through a one-directional conductive foam (such as conductive material 340) coupled between the readout matrix and the traces.

An array or tester unit may contain only detector pixels, only injector pixels, or dual function injector—detector pixels (e.g., sometimes referred to as "injector and detector pixels" herein) in various configurations, were pixels that have a capability to inject and detect (e.g., as will be shown below with respect to FIGS. 6 and 7). Thus, a PCB trace tester, according to embodiments of the invention, may include an array of only injector pixels, only detector pixels, a mixture thereof, or pixels having the capability to inject and detect. For instance, FIG. 2B shows and embodiment where array 255 includes injector pixels of pixel array 180, and injector and detector pixels of pixel array 280.

Referring to FIG. 2B, according to embodiments, the top view cross sectional size of an array of injector and/or detector pixel may be between the number 1×1 in and 3×3 feet. Specifically, the cross-sectional size of an entire PCB trace tester may be 1, 2, 4, 8, 10, 20, 40, a combination thereof, or any number of inches squared. Likewise, it is contemplated that each injector or detector pixel or electrode may have a size between 30×30 microns (e.g., E-6 meters) and 2×2 millimeters. Specifically, each pixel or electrode may have a dimension of 0.1, 0.2, 0.4, 0.8, 1, a combination thereof, or any number of millimeters squared in size.

Moreover, it is contemplated that the pixels may have various shapes. For example, within the top view size dimensions described above, each pixel may have a rectangular, hexagonal, octagonal, triangular, circular, curved and/or combination thereof of shapes.

Additionally, there may be spacing or gaps between the edges or boundaries of pixels such as to provide space in substrate 160 for driver lines, readout lines or other interconnects or electronics that may or may not be connected to the pixels and/or semiconductor based devices connected to the pixels. For example, FIG. 2B shows vertical spacing VSP and horizontal spacing HSP between electrodes, or each spacing may be a distance between 1 and 100 microns. It is also contemplated that the spacing of VSP may be equal to, greater than, or less than the spacing of HSP of all or any of the electrodes.

Figure 2C:
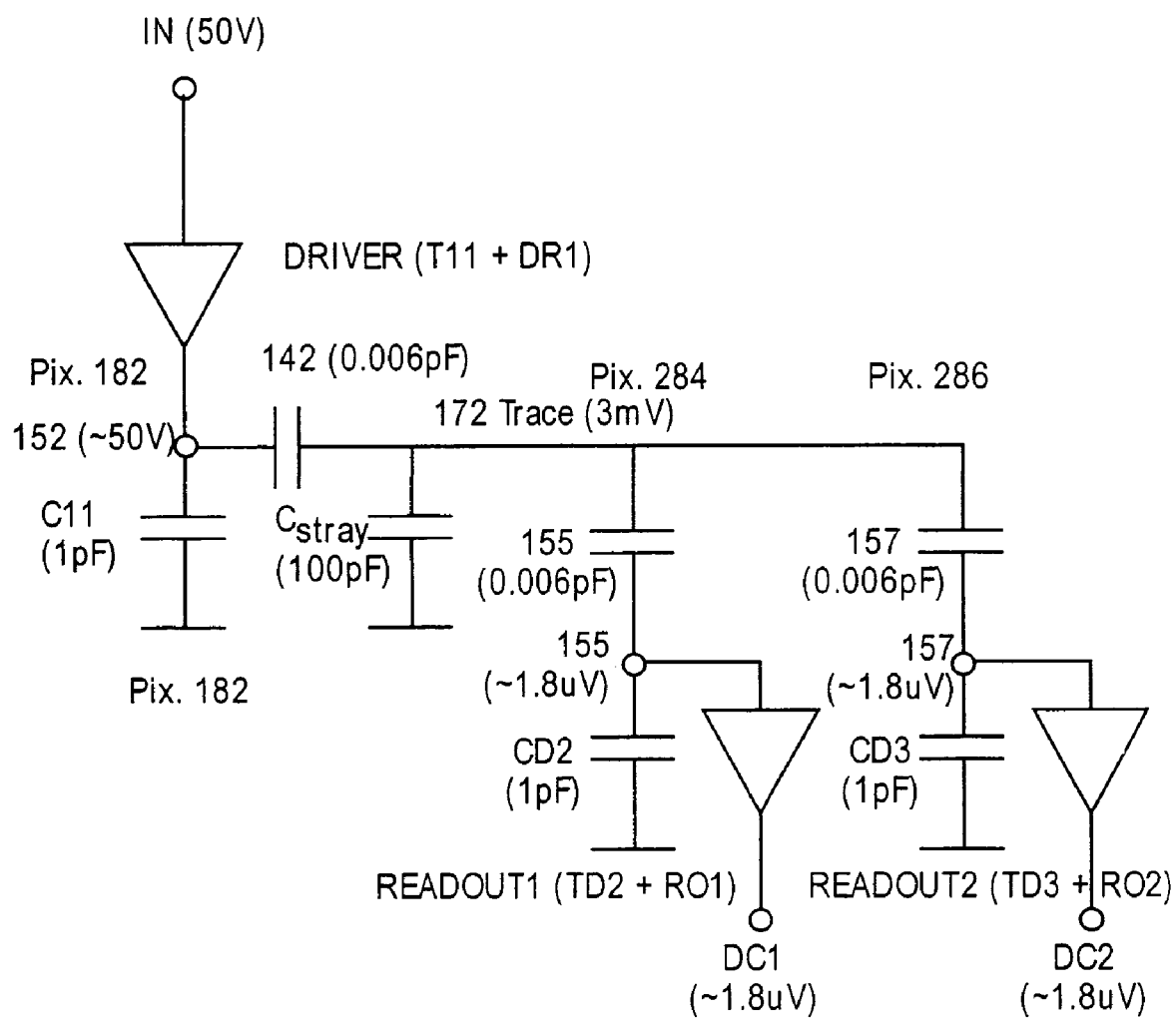
FIG. 2C illustrates an electrical equivalent circuit of FIG. 2A with some typical signal values.

However, drawbacks may exist for a tester 102 and/or tester 202. Such drawbacks may include degraded coupling efficiency. FIG. 2C gives an electrical equivalent circuit of FIG. 2A with some typical voltage values given in brackets. The voltage values may be calculated based on the following assumptions: Input voltage on pixel 182 is 50V, pixel size (both driver and readout pixels) are 127 um×127 um with a fill factor of 100%, the insulator material 140 is 120 um thick and has a relative permittivity of 5, the pixel capacitances (both driver and readout) are 1 pF, the sum of stray capacitances of trace 172 is 100 pF, and trace 172 fully covers pixels 182, 284 and 286. The method applied in FIG. 2A, may use capacitive coupling 142 between the injector electrode 152 and the PCB trace 172 above it. The PCB traces also have capacitances to ground plane(s), other traces, and/or other detector pixels. The sum of these capacitances is shown on FIG. 2C as $C_{stray}$. According to FIG. 2C, the voltage induced on trace 172 is divided by the ratio of coupling capacitance 142 and stray capacitance Cstray of 172 to ground and to other traces (such as to trace 174 on FIGS. 2A and 2B) as well as to other pixel capacitances (CD2, CD3, etc.). Furthermore, for simplicity, in FIG. 2C, the DR1 and TI1 are shown combined into DRIVER block; TD2 and RO1 are shown combined into REDOUT1 block, and similarly TD3 and RO2 are shown combined into READOUT2 block. In FIG. 2C all the switches (e.g., TI1, TD2 and TD3) are in ON state.

It is well known from basic electronic theory that when we apply a voltage on capacitor network where capacitors are connected in series, then the voltage will be divided on the capacitors as the inverse ratio of their capacitance values. Thus, in FIG. 2C, if we introduce to pixel 182 a charge that generates 50V on electrode 152, the voltage induced in trace 172 may only be 3 mV. The signal (induced voltage) further drops on the electrodes 155 and 157 of detector pixels 284 and 286 according to the ratio of the coupling capacitor(s) (145 and 147) to the pixel capacitor(s) (CD2 and CD3) respectively. The signals per detector pixel gets smaller as the size of the trace gets larger because the stray capacitance $C_{stray}$ of trace 172 increases.

Likewise, stray capacitances may exist in or due to the configuration of PCB traces, PCB insulator layers, and/or the configuration or layout thereof. For example, a conductive layer disposed above insulator 105 may cause stray capacitance through insulator 105 between trace 172 and the conductor above insulator 105. Such stray capacitances may cause a loading effect further decreasing the coupling efficiency of tester 102 and/or 202. The stray capacitance is especially bad if a large area trace is to be addressed, and a large area ground or power plane is disposed in the PCB proximate to the trace to be addressed. In such cases, the stray capacitance can be as high as hundreds of pF. It is possible in such case that the signal readout at DC1 and DC2 may drop to 1.8 micro Volts (uV), which may be below the noise level of the readout electronics connected to pixel 284 and 286.

Moreover, it may be desired to have the gating pulse for the switches of FIG. 2A (e.g., such as the pulse, at gate line GD2 or switch TD2, greater than the excitation pulse, e.g., CHG1) not to turn on adjacent gates of non-addressed semiconductor based switches of other pixels. Similarly, injector voltage at or greater than 50 volt pulses, may be at or exceed the breakdown voltage of a semiconductor based switch, such as a silicon TFT switch (e.g., such as switch TI1, TD2, and/or TD3).

To avoid the previous drawbacks (i.e. low coupling efficiency and application of high voltage pulses), according to embodiments, a "direct" excitation of traces using a directional conducting material may be possible with pulse addressing, an addressing matrix, group addressing, direct trace addressing, DC voltage, or other addressing of pixels, as described above with respect to FIGS. 1 and 2A and B. The directional conducting material may only conduct in a direction between injection pixels and PCB traces. In some cases, the directional conductive material may be described as an insulating material or as a conductive material, having a bottom and top surface and having a directional electrical conductivity only in a direction corresponding to a path in a direction from the bottom to the top surface, and/or only in a direction corresponding to a path in a direction from the top to the bottom surface. In some cases, the directional conductive material may be configured to have a directional conductivity only in a direction substantially perpendicular to the bottom, and/or substantially perpendicular to the top surface of the material (e.g., such as a direction extending between the bottom and top surface of the material at an angle perpendicular to one or both of those surfaces). The directional electrical conductivity may also be only from a contact point on the bottom surface to the top surface (or to a contact point on the top surface), and from a contact point on the top surface to the bottom surface (or to a contact point on the bottom surface). Moreover, the directional conductive material may have conductivity in one or more directions or vectors to and from the bottom and top surface to reduce, minimize, or eliminate cross talk between neighboring pixels of the tester and neighboring traces of a PCB.

Thus, in embodiments, the direct conduction in one direction of the material allows the same charge or voltage to be injected into the trace from an injection pixel, and in the reverse direction allows a large readout to be detected at each detector pixel from a charge or voltage (and in some cases, the readout may be the same voltage as the injected voltage).

Figure 3:
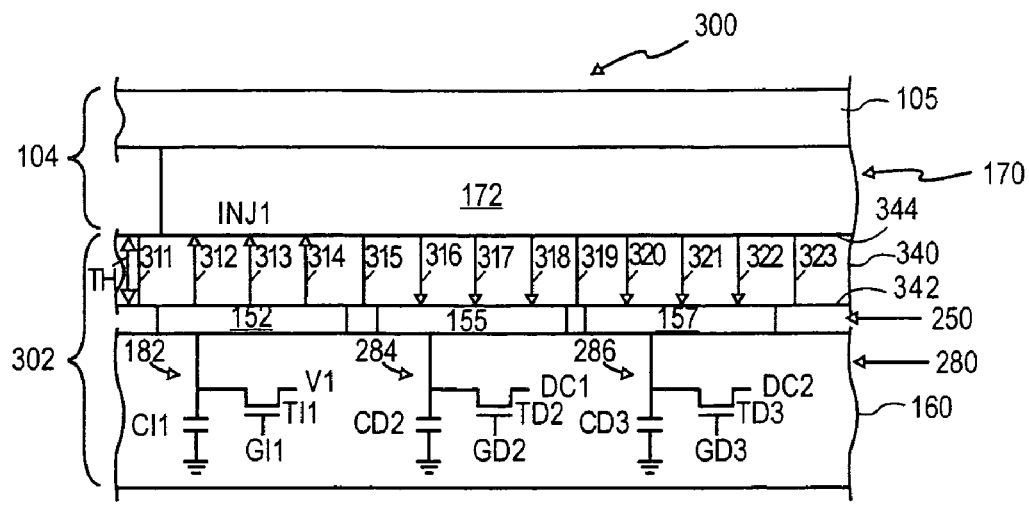
FIG. 3 illustrates a cross-section of an embodiment of an injector/detector tester coupled to traces of a PCB.

For example, FIG. 3 illustrates a cross-section of an embodiment of an injector/detector tester coupled to traces of a PCB. FIG. 3 shows arrangement 300 including conductive material 340, which is a directionally electrically conductive material, coupled (such as by being electrically coupled) between trace 172 and electrode array 250. Thus, a voltage injected by injector pixel 182 may be conducted directly to trace 172. Specifically, as shown in FIG. 3, voltage V1 may be injected to electrode 152 and electrically conducted via directionally conductive material 340 to trace 172 as injected voltage INJ1. Voltage V1 may be in a range of 0.1 to 100 volts, such as 0.5, 1, 2, 4, 5, 8, 10, 20, a combination thereof, or any number of volts (V) in voltage.

Material 340 may also be described as an insulating material having conductive elements, paths, or fibers disposed, configured, or arranged to conduct directionally, such as along one axis of a Cartesian coordinate system, (e.g., such as by conducting only in the plus and minus z-direction and not in the x or y direction) with respect to the top or bottom surface of the material. It is also contemplated that material 340 may be configured to conduct electricity in directions corresponding to a path between a contact point on bottom surface 342 and a contact point on top surface 344 of material 340.

For example, FIG. 3 shows material 340 having conductive paths 311, 312, 313, 314, 315, 316, 317, 318, 319, 320, 321, 322, and 323 conducting only in a direction between surface 342 and 344. Conductive paths 312, 313, and 314 may directionally conduct a charge or voltage injected to electrodes of electrodes of array 150 into trace 172 as injected voltage INJ1. For instance, a charge injected into an electrode coupled to a conductor may not be a voltage, but a voltage injected into or applied to an electrode coupled to a conductor may be a source or supply of voltage to a device attached to the conductor. Injected voltage INJ1 may then be conducted to electrode 155 by paths 316, 317, and 318; and conducted by paths 320, 321, and 322 to electrode 157, respectively. Paths 311, 315, 319, and 323 are not coupled (electrically coupled) to any of the electrodes, no charge or voltage is conducted on those paths (e.g., those paths are an open circuit). Thus, in an embodiment where the voltage injected by voltage V1 is 5 volts, injector pixel 182 may inject the 5 volts into electrode 152 to be conducted as injected voltage INJ1 equal to 5 volts. In turn, injected voltage INJ1 equals to 5 volts may be conducted to electrodes 155 and 157, stored in capacitors CD2 and CD3, and switch by switches TD2 and TD3 as detected voltages DC1 and DC2 equal to 5 volts each. It can be appreciated that injector detector tester 302 may be much more electrically efficient than tester 202.

According to embodiments, material 340 may be a directionally conductive material or insulating material having directional conduction that includes a layer of electrically insulating material, a number of disconnected conductive fibers extending from the bottom surface to the top surface of the material to form the directional conductive paths. It is contemplated that the layer may be a single or multiple layer of such material, where the material may be a film, flexible silicon rubber, and insulator material, a hardened epoxy, a plastic, foam, rubber, a flexible material, a soft insulating material, or a non-flexible material. Moreover, the conductive paths may be separated, individual, or linked together electrically conductive fibers that form conductive paths from the top to the bottom surface, such fibers may described as electrically conductive conduits, paths, elements, or wires embedded, disposed through, or extending through the insulator material, and each insulated from most or all adjacent fibers by the insulating material. The fibers may be a conductive material such as gold, silver, aluminum, lead, carbon, a metal, and/or ferromagnetic fibers. Also, the fibers may be or include semiconductor materials. In some cases, the resistivity of the fibers may be in the kilo ohm range or even in range of a few Mega ohm's.

In some embodiments, material 340 may be formed by magnetically aligning ferromagnetic fibers in an insulating material prior to hardening of the insulating material. For example, the insulating material may be a "soft" or unhardened silicon or epoxy with conductive fibers (e.g., such as carbon fibers) therein. A magnetic and/or electric field may be applied to the material to align the fibers within the material prior to, or during hardening of the silicon or epoxy. A material may be hardened onto pixel array 180, pixel array 280, electrodes of array 150 and/electrode array 250. Alternatively, the material may be hardened and then attached, coupled, adhered, laser bonded, or heat bonded to the arrays and/or electrodes. It is also contemplated that a material may be formed or hardened and then sliced and/or planarized into layers for attaching or coupling to electrodes of electrodes of array 150 and/or 250. Material 340 may include a light blocking insulator, several layers of varying materials, a mechanically protective material and/or have a thickness as described above with respect to material 140 to balance between providing adequate protection of traces 170 and a sufficient number of conductive paths between the traces and the electrodes.

Figure 4:
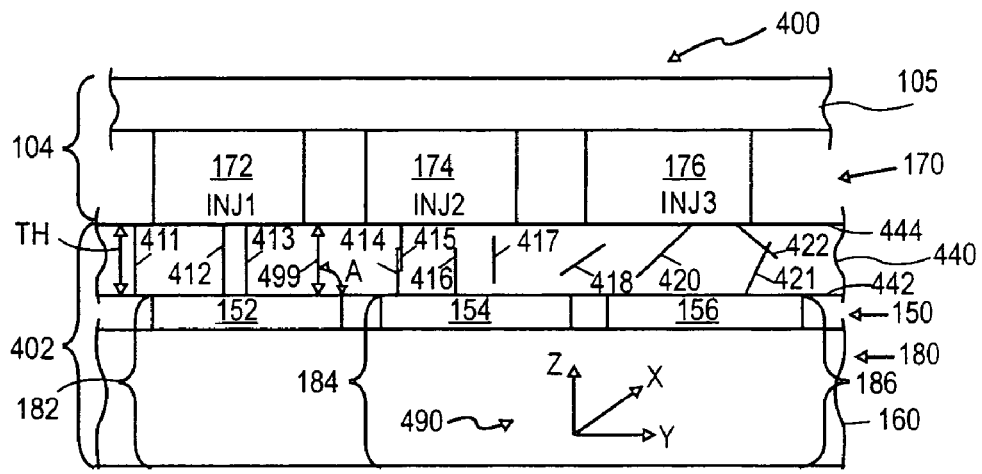
FIG. 4 illustrates an embodiment of a conductive material having conductivity only in a direction corresponding to a path between the bottom surface and top surface of the material, coupled between an electrode array of a tester and traces of a PCB.

For example, FIG. 4 illustrates an embodiment of a conductive material having conductivity only in a direction corresponding to a path from the bottom surface to the top surface and from the top surface to the bottom surface of the material, coupled between an electrode array of a tester and traces of a PCB. Arrangement 400 of FIG. 4 includes PCB 104 coupled to injector tester 402. Tester 402 includes directionally conductive material 440 coupled to injector pixel array 180, such as the array described above with respect to FIG. 1. Thus, injector pixels 182, 184, and 186 may inject charges to generate voltages INJ1, INJ2, and INJ3 into traces 172, 174, and 176 when a voltage injected to electrodes 152, 154, and 156 is directionally conducted through material 440, into those traces, respectively. Material 440 may be a directional conducting material similar to material 340, as described above.

Specifically, FIG. 4 shows material 440 having conductive fibers 411, 412, 413, 414, 415, 416, 417, 418, 420, 421, and 422 disposed therein, such as where each fiber defines an electrically conductive path along its length. FIG. 4 shows material 440 having fiber 412 and 413 coupled (electrically coupled) to trace 172 and electrode 152. FIG. 4 also shows fibers 414 and 415 coupled (e.g., electrically coupled) between trace 174 and electrode 154). Specifically, fiber 414 is coupled to electrode 154 and to fiber 415, while fiber 415 is coupled to fiber 414 and trace 174, thus completing the conductive path. Fiber 416 is coupled to electrode 154 but does not extend and is not coupled to (e.g., does not touch) trace 174. Fiber 417 and 418 are shown not coupled to any trace or electrode. Fiber 420 is shown at an angle with respect to surface 444, coupled to trace 176, but not coupled to electrode 156. Fibers 421 and 422 are shown at angles with respect to surface 444 and surface 442 and coupled to trace 176 and electrode 156, respectively. Although neither fiber 412 nor 422 completes a directionally conductive path between trace 176 and electrode 156, fibers 421 and 422 are coupled (electrically coupled and/or touching) to each other, thus completing a directionally conductive path between trace 176 and electrode 156.

According to embodiments, material 440 may be defined as a conductive material having bottom surface 442 and top surface 444, and a directional electrical conductivity (e.g., configured during formation of the material) only in a direction corresponding a path in directions 499 from surface 442 to surface 444, and from surface 444 to surface 442. Directions 499 may be defined at angle A with respect to bottom surface 442. Specifically, fibers 412, 413, 415 and 416, 421 and 422, and 411 (although 411 is not coupled to an electrode or trace) form a conductive path (e.g., electrically conductive with substantially no or very low resistance or impedance) between surface 442 and 444 in directions 499. In the case of fibers 414 and 415, although neither fiber alone completes the conductive path, both fibers together satisfy a conductive path in directions 499. Likewise, although fibers 421 and 422 are disposed at an angle with respect to surfaces 442 and 444, the combination of the two fibers forms a conductive path in directions 499 since a line directed through the contact points of the fibers and the surfaces is in directions 499. However, fibers 416, 417, 418, and 420 do not satisfy the directional electrical conductivity between the two surfaces. According to embodiments, angle A may be substantially perpendicular to surface 442. For example, angle A may be an angle of 0, 0.1, 0.2, 0.4, 0.8, 1, 2, 4, a combination thereof, and/or a number therebetween of degrees with respect to surface 442 at direction 499.

In other words, material 340 or 440 may have a directional conductivity configured to be in a directions corresponding to directions 499, but having no substantial electrical conductivity in direction other than corresponding to directions 499. Specifically, material 340 or 440 may have a directional conductivity in the direction along or parallel to the z-axis of coordinate system 490 as shown in FIG. 4, but having no substantial electrical conductivity in directions other than along or parallel to the z-axis such as by having no substantial electrical conductivity with respect to directions having a vector component along the x or y axis (e.g., where the plane defined by the x and y axis defines a top or bottom surface 342 and 344, or 442 and 444, of material 340 or 440, respectively).

Material 340 and/or 440 may have a thickness between the top and bottom surface of between 10 micrometers and 2000 micrometers in thickness. For example, FIG. 4 shows material 440 having thickness TH that may be a thickness of 100, 200, 400, 800, a combination thereof, or any number thereof of microns in thickness.

It can be appreciated that the spacing of conductive path or fibers in material 340 or 440 creating a conductive path between the top and bottom surface of that material may vary. Thus, it is desired that at least one conductive path were conducted fiber exist in the material disposed above each electrode (e.g., above each electrode 152, 154, 155, 156, and 157) to conduct electricity between the electrodes and traces disposed over or above the electrodes (e.g., and coupled to the other end of the paths or fibers). In some cases, the density of paths or fibers required in material 340 or 440 will require a spacing of no less than two fibers in a cross-sectional area defined for a top view of each electrode or pixel (e.g., cross-sectional area described above with respect to FIG. 2B). It is also considered that the diameter (e.g., cross sectional diameter with respect to the longitudinal axis, such as a diameter viewed from a top perspective like the view of FIG. 2B) of a path or fiber may be smaller than the gap between the pixels. For example, from above, the diameter of path 315 of FIG. 3, fiber 411 of FIG. 4, or path 515 of FIG. 5 may be small enough that the path or fiber does not extend across the gap between two electrodes (e.g., does not extend the gap between electrode 152 and 155 or 154). For example, the diameter may be less than spacing VSP, and spacing HSP as shown in FIG. 2B. It is also noted that in some cases, if the diameter is reduced, additional electrical current may be used to inject a sufficient amount of charge or voltage into a trace from an electrode of an injector pixel.

In addition, the directional conductive material may include conductive paths or fibers that extend beyond the surfaces of the materials. For example, conductive carbon fibers may extend slightly above the top surface (e.g., surface 444) and slightly below the bottom surface (e.g., surface 442) of an insulator through which they are disposed to ensure coupling or touching of the path or fiber with traces and electrodes above and below the material.

Specific examples of a directional conductive material (e.g., such as material 340 or 440) include a fiber/epoxy medium put into a magnetic system to align the fibers to make contact between the upper and lower surface of the medium. Such a material may have an ability to provide directional conduction between the two surfaces with a 200 micron pixel pitch capability. It is also contemplated that the pixel pitch capability may be a resolution of less than 250 micron pixels, less than 100 micron pixels, or less than 50 micron pixel pitches. In addition, the resistance of a material in the conductive direction may be a resistance of 0, 0.1, 0.2, 0.4, 0.8, 1, 2, 4, 8, a combination thereof or any number there between of Ohms. Also, according to some embodiments, the resistance of a material in the conductive direction may be a resistance of in the kilo ohm range, or even in a range of a few Mega ohms. Alternatively, for directions other than the direction of conduction (e.g., other than in the Z direction), a resistance of the $10^9$, $10^{10}$, $10^{11}$, $10^{12}$, $10^{13}$, $10^{14}$, $10^{15}$ a combination thereof, or a number there between of Ohms may be provided by the material. In one case, the X/Y resistance of the materials is greater than $10^{13}$ Ohms between adjacent electrodes of the tester, and/or adjacent traces of PCB. One issue is that the lateral to vertical resistivity ratio should be 100 or higher and of course, the lateral resistivity cannot be too high otherwise, it would take very long time to charge the traces (the stray capacitances of the traces) to the required voltage.

Furthermore, an embodiment of a directionally conductive material (e.g., such as material 340 and 440) includes conductive carbon fibers embedded symmetrically into a sheet of silicon rubber, such as to form an Anisotropic Fiber (AF) connector, "Zebra" connectors (e.g., a connector that conduct in the Z direction and the conductive paths are similar to stripes of a zebra). It is possible to create various shapes of such a sheet using punch-out manufacturing.

Additionally, the directionally conductive material may have material thickness (e.g., see thickness TH of FIGS. 3-4) of 0.2, plus or minus 0.05 or; 0.3 plus or minus 0.05 millimeters. The material map also include conductive fibers having a diameter of between 3 and 20 micrometers; a shore hardness A of between 65 and 73; a compression set of between 30 and 35 percent; a contact resistance of less than 10 Ohms per milliliter cube; an insulation resistance of greater than 103 mega-Ohms (at direct current 500 volts); a dielectric breakdown voltage of 23 to 27 KV/mm; an operating temperature range of between minus 25 and plus 85 degrees Celsius; and/or a size of between 1.0 and 170 millimeters in length and/or width. These numbers are only illustrative, as other specifications for the material are considered as well.

Figure 5:
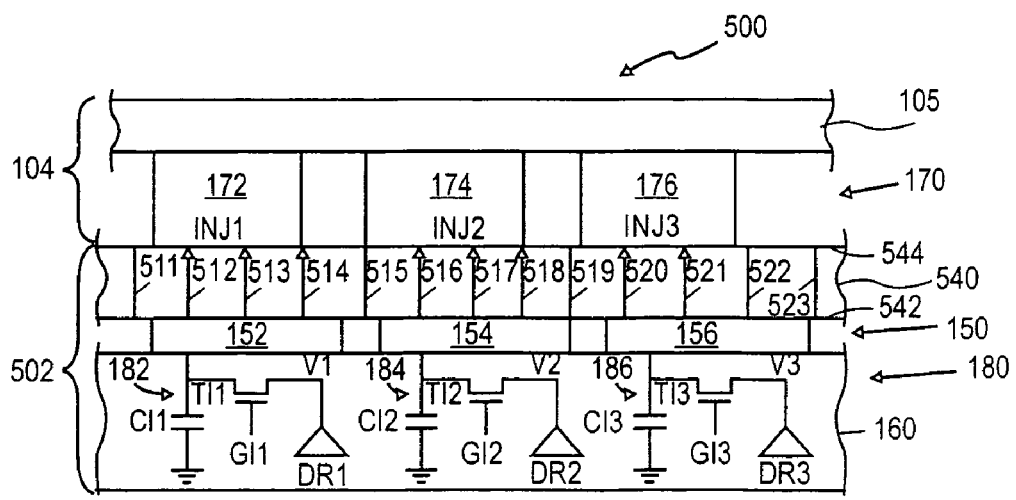
FIG. 5 illustrates a cross-section of an embodiment of an injector tester coupled to traces of a PCB.

FIG. 5 illustrates a cross-section of an embodiment of an injector tester coupled to traces of a PCB. FIG. 5 shows an arrangement 500, including PCB 104 coupled to injector tester 502. Tester 502 includes material 540 coupled to pixel array 180. Material 540 may be a material such as material 440 of FIG. 4 or material 340 of FIG. 3. For example, material 540 has surfaces 542 and 544 (e.g., similar to surfaces 342 and 344 of material 340), and may have a directional conductivity between surfaces 542 and 544 similar to the conductivity described above with respect to material 340 and/or material 440. Moreover, the cross-sectional view of FIG. 5 may be the structure shown in FIG. 3 from a different cross-sectional side perspective view.

Similar to the description above for surfaces 149 and 148, surfaces 344 and 342 of FIG. 3, surfaces 444 and 442 of FIG. 4, and surfaces 544 and 542 of FIG. 5 may be considered a top or first surface, and a bottom or second surface respectively.

For example, material 540 is shown in FIG. 5, including directional conductive paths 511, 512, 513, 514, 515, 516, 517, 518, 519, 520, 521, 522, and 523 conducting only in a direction between surfaces 542 and 544. According to some embodiments, path 512 may be the same path as path 312 of FIG. 3. As described above with respect to FIG. 4, pixel array 180 includes pixels 182, 184, and 186 for injecting charges or voltages into traces 172, 174, and 176.

More particularly, FIG. 5 shows pixel 182, including some structure described above for that pixel with respect to FIG. 2A. Similarly, FIG. 5 shows pixel 184, including capacitor C12 coupled between electrode 154 and ground; switch TI2 coupled between electrode 154 and driver DR2, and having gate line GI2. Driver DR2 may provide voltage V2 to electrode 154 when gate line GI2 activates switch TI2. Similarly, pixel 186 includes capacitors CI3 coupled between electrode 156 and ground, switch TI3 coupled between electrode 156 and driver DR3, and coupled to gate line GI3. Driver DR3 provides voltage V3 to electrode 156 when gate line GI3 activates switch TI3. Voltages V2 and V2 may be voltage values as described above for voltage V1.

Capacitors C12 and C13 may correspond to the description at FIG. 2A for capacitor CI1; switch TI2 and T13 may correspond to and/or be controlled similar to the description at FIG. 2A for switch TI1, gate line GI2 and G13 may correspond to and/or be controlled similar to the description at FIG. 2A for gate line GI1, driver DR2 and DR3 may correspond to the description of FIG. 2A for driver DR1; and voltages V2 and V3 may correspond to and/or be controlled similar to the description at FIG. 1 and FIG. 2A and B for charge CHG1.

It can be appreciated that tester 502 may be used to produce a desired amount of voltage on a single trace, such as if tester 502 were used in place of tester 302 in FIG. 3 to produce voltages INJ1, INJ2, and INJ3 on trace 172, 174 and 176 respectively. Thus, conductive paths 512, 513, and 514 may conduct the same voltage produced at electrode 152 into trace 172 as injected voltage INJ1. Similarly, paths 516, 517, and 518 may induce a voltage provided electrode 154 to trace 174 and induced voltage INJ2; and paths 520 and 521 may produce a voltage at electrode 156 to trace 176 as injected voltage INJ3. Paths 511, 515, 518, 522, and 523 are not coupled between a trace and an electrode and therefore do not conduct a charge or voltage (e.g., they are open circuits). In some embodiments, it is contemplated that paths 511, 312, and 513-523 may be unidirectional conductive paths only in a single direction from surface 542 (or contact points thereon) to surface 544 (or contact points thereon).

Although FIG. 5 shows multiple conductive paths for each electrode, as noted above, as long as one conductive path exists between each electrode and each trace to be tested (e.g., such as by having two electrodes within the cross-sectional face of one pixel as described with respect to FIG. 2A), the number of conductive paths is sufficient. Specifically, if only every other path shown in FIG. 5 exists, material 540 will be sufficient to test traces 170. Specifically, if only paths 511, 513, 515, 517, 519, 521, and 523 existed, there would be a conductive path between each electrode and each trace. Likewise, if only paths 512, 514, 516, 518, 520 and 522 existed, that would be sufficient as well. The same is true with respect to the conductive paths for material 340 shown in FIG. 3.

According to embodiments, a pixel may include the capability to introduce voltage onto a trace (e.g., induction, or directional conduction by the pixel into a trace) as well as the ability to detect a voltage currently present in a trace (such as by the present voltage being inducted or directionally conducted into the pixel). For example, FIG. 6 illustrates a cross-section of an embodiment of an injector and detector tester coupled to traces of a PCB. FIG. 6 shows arrangement 600, including PCB 104 coupled to injector and detector tester 602. Tester 602 includes material 340 coupled to a voltage or charge injector and detector pixel array 680 having injector and detector pixels 682, 684, and 686, which include electrode 152, 155, and 157 coupled to pixilated electronics (e.g., such as a semiconductor based devices like a-Si, ASIC, CMOS and/or TFT devices) of substrate 160, respectively.

Representing one type of detector and injector pixel, pixel 682 includes capacitor C1 coupled between electrode 152 and ground, and switch T1 coupled between tri-state driver TS1 and readout circuit RO11. Switch T1 includes gate line G1 to provide a signal to activate switch T1 to allow a voltage from tri-state driver, such as voltage V1, to be conducted to electrode 152. Likewise, when switch T1 is activate, a voltage gathered at electrode 152, such as from trace 172 and stored in capacitor C1 may be switched to readout circuit RO11 to provide detection signal D1. Tri-state driver TS1 is shown having tri-state enable TE, such as to enable driver TS1 to behave like an injection driver, such as DR1; or to disable driver TS1, so that the outputs of driver TS1 are completely disconnected from the rest of pixel 682 (e.g., such as by forming an open circuit between the output of driver TS1 and readout circuit RO11, and between the output of driver TS1 and switch T1). For example, when the signal at tri-state enable TE is active (e.g., such as by being a "high" or a "1") TS1 may act, as described above, with respect to driver DR1. Alternatively, when the signal at tri-state enable TE is inactive (e.g., such as by being a "low" or a "0"), the output of driver TS1 will be disconnected from 'switch T1 as well as readout circuit RO11.

Another embodiment of an injector detector pixel, pixel 684, includes capacitor C2 coupled between electrode 155 and ground, and switch T2 coupled between electrode 155 and driver DR2 and readout circuit RO12. Switch T2 also includes gate line G2 such as to activate switch T2 allowing a voltage generated by driver DR2, such as voltage V2, to be injected to electrode 155. Likewise, when gate line G2 is active, a voltage on electrode 155, such as conducted from trace 172 or another trace of traces 170 to electrode 155 through material 340 and gathered in capacitor C2, to be switched to readout circuit RO12 and provided as detection signal D2. Pixel 684 also shows switch Si coupled between driver DR2 and switch T2, and coupled between driver DR2 and readout circuit RO12. When switch S1 is in open position O, driver DR2 is disconnected from switch T2 and from readout circuit RO12 (such as by forming an open circuit between driver DR2 and switch T2, and between driver DR2 and readout circuit RO12). Alternatively, when switch Si is in closed position C, driver DR2 is coupled (e.g., such as being electrically connected with 0 or very low resistance) to switch T2 and to readout circuit R2. Thus, it can be appreciated that switch Si provides a similar functionality as tri-state enable TE of tri-state driver TS1. Specifically, when switch S1 is enabled, switch S1 may be in position C, and when switch S1 is disabled, switch Si may be in position O. It is contemplated that the enable and disable position of tri-state enable TE and/or switch S1 may be reversed in some embodiments.

According to embodiments, array 680 may include all, some, or no pixels similar to pixel 682 or pixel 684. For example, pixel 686 may include electrode 157, capacitor C3, switch T3, gate line G3, readout circuit RO13, detection signal D3, and voltage V3 similar to the corresponding structures described with respect to pixel 682. In addition, pixel 686 may include a driver DS3 similar to tri-state injector TS1, or similar to driver DR2 and switch S1. Moreover, driver DS3 may include other semiconductor based switching devices like a-Si, ASIC, or TFT, CMOS or other switching devices capable of functioning similar to driver TS1, or driver DR2 and switch S1.

According to some embodiments, pixels 682, 684, 686, 782, 783, 784, 785, 786, and/or 787; drivers DR1, DR2, DR3, DS3, and/or tri-state driver TS1 may be used to inject or induce a charge (e.g., inject a selected charge into electrodes of array 150 to be capacitively coupled to induce a charge in traces 170) (See FIGS. 1-2), inject a pulse voltage (e.g., inject a voltage that quickly ramps to a peak and dies off into traces 170 through a conductor electrically coupled between the traces and electrodes of array 150) (See FIGS. 3-6), or inject a direct current voltage (e.g., inject a constant level voltage for a period of time into traces 170 (e.g., a period sufficient to allow for detection from traces 170) through a conductor electrically coupled between the traces and electrodes of array 150) (See FIGS. 3-6).

Pixels 182, 184, 186, 284, 286, 682, 684, 686, 782, 783, 784, 785, 786, and/or 787 may include or exclude a capacitor (corresponding to capacitor CI1 or CD2 of FIG. 2). For instance, when a DC voltage is applied to a driver, it may not be necessary to have a capacitor (or inherent capacitance) in the driver (e.g., the capacitor, such as capacitor CI1 of FIG. 2, can be excluded from pixels 182, 184, 186, 682, 684, and 686) or in the detector pixels (e.g., the capacitor, such as capacitor CD2 of FIG. 2, can be excluded from pixels 284, 286, 682, 684, and 686). Similarly, the capacitor may not be needed when applying voltage pulses with the length of the pulse in time that is longer than the total readout time of the imager. If the total readout time is shorter than the pulse time, the capacitor can be used in the driver (e.g., the capacitor, such as capacitor CI1 of FIG. 2, can be included in pixels 182, 184, and 186) and in the combined driver/readout pixels (e.g., the capacitor, such as capacitor CI1 of FIG. 2, can be included in pixels 682, 684, and 686), which keep the voltage level(s) in the pixels until the level is read out.

Figure 6:
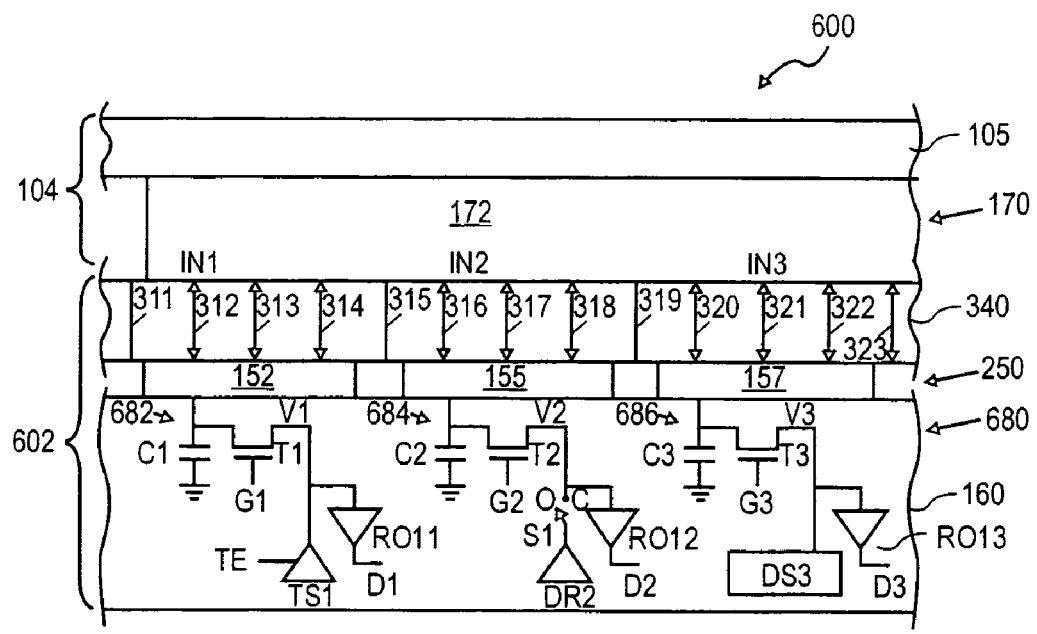
FIG. 6 illustrates a cross-section of an embodiment of an injector and detector tester coupled to traces of a PCB.

Furthermore, control or addressing of pixel array 680 of FIG. 6 may be performed as described above at FIG. 2B with respect to control or addressing of pixels.

One objective of using driver TS1, driver DR2 and switch S1, or a driver at DS3 is to disconnect the driver output from the connection between the switch and the readout circuit so that the voltage switched to the readout circuit (e.g., the voltage on capacitor C1, C2, or C3 going through switch T1, T3 or T3 and to readout circuit RO11, RO12, or RO13) is not "shorted through" a driver (e.g., TS1, DR2, or DS3) (such as by a conductive path existing through the driver that reduces the signal received by the readout circuit sufficiently to cause an inappropriately readout or detection voltage at D1, D2 or D3). For example, if a driver provides a sufficient conductive path to allow the readout signal or detection charge switched to a readout driver to be below the S/N or signal to noise ratio, a readout signal or detection charge that should be detected may not be sufficient to provide detection. It can be appreciated that driver DS3 may include devices or circuitry other than a tri-state driver or a switch to provide such functionality.

In addition, it is contemplated that array 680 may include various other configurations of semiconductor based electronic devices, such as a-Si, ASIC, TFT, poly-silicon TFT, organic TFT, CMOS and any other type of switching devices and/or those described with respect to pixel array 180 and pixel array 280, to provide the functionality of pixel 282, 684, and/or 686.

Having material 340 coupled between electrode array 250 and trace 172 allows voltage from any electrode to be conducted into trace 172 as well as voltages within trace 172 to be conducted to any electrodes such as for detection. Specifically, voltage V1 may be provided by driver TS1 and switch by switch, T1 to electrode 152, from where the voltage is conducted along conductive paths 312, 313, and 314 into trace 172 as voltage IN1. Injected voltage IN1 can be detected by pixels 684 and 686, similar to the description above with respect to FIG. 3, and detecting voltage INJ1 at pixels 284 and 286.

Moreover, voltage V2 may be provided by driver DR2 and switch-by-switch T2 to electrode 155, from where the voltage is connected by conductive paths 316, 317, and 318 to trace 172 as voltage IN2. Voltage IN2 can similarly be detected at pixel 682 and pixel 686 by conduction of voltage IN2 through conductive paths 312, 313, and 314 to electrode 152, and by paths 320, 321, and 322 to electrode 157, respectively.

A similar concept applies by applying voltage IN3 from pixel 686 into trace 172 and detecting that voltage at pixel 682 and/or pixel 684. Thus, it can be seen that having injection and detection pixels in array 680, tester 602 may provide, in certain situations, a more versatile and efficient tester than tester 302 or 502. It is also contemplated that array 680 of FIG. 6 may be used with insulator material 140 coupled between array 680 and traces of a PCB to test the traces.

For example, although FIG. 6 shows trace 172 coupled to material 340, the configuration of trace 172, trace 174, and trace 176 of traces 170 could be coupled to material 340, such as shown in FIG. 5. In this instance, each pixel of array 680 would be capable of functioning similar to pixels 182, 184, and 186 as described with respect to FIG. 5, as well as functioning similar to pixels 284 as described with respect to FIG. 2A. Thus, is can be appreciated that tester 602 may allow at least one side or layer of traces (e.g., exposed traces on an exterior layer of a PCB) to be tested by a single testing device. It is also contemplated that a tester such as tester 102, 202, 302, 402, 502, or 602 may be used to test traces or a trace layout on a single side of a PCB. In addition, it is contemplated that a tester such as tester 102, 202, 302, 402, 502, or 602 may be applied to more than one surface, side or exposed layer of traces of a PCB to test traces or a trace layout of a PCB. For example, for a PCB having a top side and bottom side (e.g., such as where traces 170 represent traces on one side of insulator 105 and the opposing side includes traces as well) any of the testers described above may be used to test traces on either or both sides of the PCB.

Figure 7:
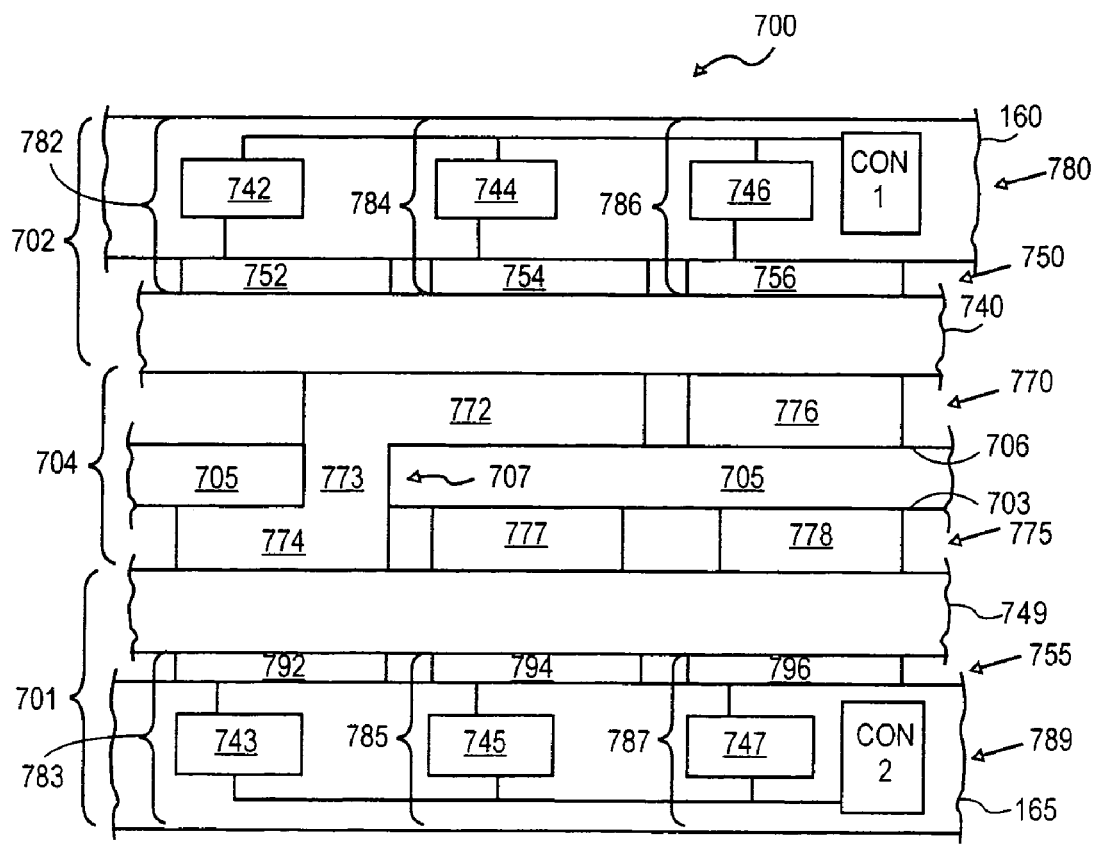
FIG. 7 illustrates a cross-section of an embodiment of two testers coupled to traces on two sides of a PCB.

For example, FIG. 7 illustrates a cross-section of an embodiment of two testers coupled to traces on two sides of PCB. FIG. 7 shows arrangement 700 including PCB 704 coupled between tester 702 and tester 701. PCB 704 includes PCB insulator 705, similar to insulator 105 described above with respect to FIG. 1. Formed on, printed on, or attached to surface 706 of insulator 705 are trace 776 and trace 772. Similarly, formed on, printed on, or attached to surface 703 of insulator 705 are trace 774, 777 and 778. Insulator 705 also includes via 707 having conductive material, such as trace 773 electrically connecting trace 772 to trace 774. Trace 772, 773, 774, 776, 777, and 778 may be traced as similar to those described above with respect to trace 172 of FIG. 1.

Tester 702 may be an inducer, an inducer/detector, and injector, and injector/detector, or an injector and detector tester as described above with respect to testers 102, 202, 302, 402, 502, or 602. For example, pixel array 780 may be an array of pixels 782, 784 and 786, where any or all of the pixels may be a pixel as described above with respect to pixel 182, 284, 682, 684, or 686. Electrodes 752, 754 and 756 may be electrodes similar to electrode 152, 154, and 156 described above with respect to FIGS. 1 and 2B. In addition, each of pixels 782, 784, and 786 may include switches 742, 744, and 746, respectively. Each of switches 742, 744 and 746 may include switches as described above and having the functionality described above with respect to switch TI1, TD2, the combination of T1 and TE, the combination of T2 and S1, and/or DS3. Thus, inducing, injecting, and/or detecting a charge or voltage may be performed by each of the pixels, and may be controlled by controller CON1.

Pixel array 780 may be formed in and on substrate 160, as described above with respect to forming pixel array 180, 280, and/or 680 of FIGS. 1, 2A, 2B and 6. Furthermore, tester 702 includes material 740 coupled between pixel array 780 and traces 770. Material 740 may be a material similar to materials 140, 340, 440, and/or 510. Thus, pixel 782, 784 and/or 786 may induce, inject, or detect a charge or voltage by induction or conduction from traces 770 through material 740. Specifically, material 740 may be an insulator material to induce by capacitance, a charge from a pixel to a trace or to induce a charge from a trace to a pixel as described for FIGS. 1, 2A and 2B. Likewise, material 740 may be a directional conducting material to directionally conduct a voltage from a pixel to a trace to conduct the voltage in a trace, or may directionally or unidirectionally conduct a voltage from a trace to a pixel as described for FIGS. 3-6.

FIG. 7 also shows tester 701 including pixel array 789 having pixels 783, 785, and 787 coupled to material 749. In turn, material 749 is coupled to traces 774, 777, and 778 of traces 775. Electrode 792, 794, and 796 may be similar to electrode 752, 754, and 756. In addition, switches 743, 745, and 747 may be similar to switches 742, 744 and 746. Likewise, pixels 783, 785 and 787 may be similar or different from pixel 782, 784, and 786. For example, any or all of pixels 782 through 787 may be a pixel as described above with respect to pixel 182, 284, 682, 684 or 686. Furthermore, controller CON2 may be similar to controller CON1. In addition, material 749 of tester 701 may be similar to material 740 of tester 702.

Thus, it is possible to test PCB 704 using various testers and processes as described herein. For example, tester 702 could be an induction tester similar to tester 102 or an injector tester similar to tester 502 to induce or inject charge or voltage into trace 772 and trace 776. The voltage generated or conducted into trace 772 may be conducted through trace 773 to trace 774. Tester 701 may be a tester similar to a tester having detector pixels 284 and material 140 or pixel 284 and material 340 as described with respect to FIGS. 2A and 3. Thus, a charge induced or voltage injected into trace 772 and conducted to trace 774 may be detected by being induced or injected to electrode 792 of tester 701. The detection at pixel 783 from electrodes 792 may be compared with an expected result to determine whether or not trace 772, 773, and 774 fail a test. Likewise, the induction or injection and detection can be reversed, such as where pixel 783 of tester 701 induces or injects the charge or voltage into trace 774 and pixels 782 and 784 of tester 702 detect the charge or voltage from trace 772.

It is contemplated that traces 772, 774, 776, 777, and 778 may have various layouts with respect to surfaces 703 and 706. For example, where surfaces 703 and 706 are two-dimensional or planar surfaces, such as shown in FIG. 2B, the traces may extend across more than one pixel in the x, or y direction as shown in FIG. 4. In addition, traces 770 and/or 775 may be similar to traces 170 as described with respect to FIGS. 1, 2A and 2B. For example, instead of PCB 704, a PCB in its place may not have any vias (e.g., such as via 707) between a top and bottom surface, and may have one or more traces on each surface of the PCB insulator material (e.g., see insulator material 705), where the traces on each side may be traces as described above with respect to traces 170. Thus, traces on either or both surface 706 and/or 703 may be tested at one time by using one or more of tester 702 and/or 701.

Moreover, it is also contemplated that tester 702 and/or tester 701 may be a tester similar to tester 602 of FIG. 6. Thus, each of testers 702 and 701 may be capable of injecting as well as detecting a charge or voltage from the traces of PCB 704. It can be appreciated that if tester 702 and 701 both include induction or injection pixels at pixel 783, and 782 or 784, embodiments may only require that one of pixels 783, 782, or 784 induce or inject a charge or voltage in trace 772 or 774. Otherwise, it is possible that charges or voltages may be shorted between the inducers for injector pixels, and/or readings may be erroneous.

In some embodiments, tester 702 may include injector or inductor pixels while tester 701 may include detector pixels. Thus, when the orientation of PCB 704 shown in FIG. 7 is tested, PCB 704 may be flipped over (or position of tester 701 and 702 may be reversed). To test the other side (e.g., where PCB 704 is oriented upside down such as to have trace 777 coupled to material 740 and trace 772 coupled to material 749) of the traces of PCB 704. Similarly, a set-up with only tester 702 and not tester 701 may be used to test PCB 704. For example, any of testers 102 through 602 may be used to test traces on surface 706 of PCB 704; and then PCB 704 may be flipped over to test traces on surface 703 with tester 702. Specifically, where tester 702 is a tester similar to tester 602, traces on surface 706 and 703 of PCB 704 may be tested by a single tester, by flipping the PCB.

Thus, arrangement 700 provides a situation where controller CON1 and controller CON2 may apply test voltages by induction or injection to a number of conductive traces of a PCB using charge or voltage injector or inductor pixels, and check a readout pattern from a number of detector capacitors of detector pixels at a number of locations associated with the conductive traces, where readout voltages from the capacitor correspond to the applied voltages. Such a concept may be termed "group addressing." Accordingly, it can be appreciated that by addressing pixels that may induce or inject a charge or voltage into a trace, while readout pixels that may detect by injection or induction a charge or voltage in a trace, it is possible to test traces on one surface, both surfaces, and/or including traces extending through vias between both surfaces 706 and 703 of PCB 704. Such addressing can be performed by controller CON1 and/or controller CON2 as well as by addressable switches in a series with each driver and/or readout circuit. Moreover, control from controller CON1, CON2, and/or such addressable switches may include control of tri-state enables such as TE, and switches such as S1, switching such as described for driver DS3, and switches such as TI1, TD2, and T1, as described herein. Furthermore, for such situations where a charge is injected or a voltage conducted to a trace, it is possible to apply injection as a constant DC voltage or a DC voltage over a greater time than a pulse time (e.g., DC voltage for a timer greater than a time used to induce a charge to material 140).

Furthermore, control or addressing of pixel array 280 of FIG. 3, pixel array 180 of FIG. 4, pixel array 180 of FIG. 5, 680 of FIG. 6, 789 of FIG. 7, and/or 785 of FIG. 7 may be performed as described above at FIG. 2B with respect to control or addressing of pixels. For example, an ASIC technology may be used to inject charges or voltages into electrodes of injector pixels using pulse addressing, and the same or a different ASIC may be used to address detector pixels to detect charges injected into traces by the injector electrodes. Moreover, in the embodiments of FIGS. 3-7, including directional conductive material between the electrodes and the traces, pulse addressing and/or pulse charges may not be necessary due to the use of directionally conductive material as opposed to insulated material to induce a capacitance, between the electrodes and the traces. For example, in these embodiments, it is possible for a controller, addressing, injector pixel, or other electronics of embodiments using directional conductive materials to apply a direct current signal or voltage to an electrode to inject the signal or voltage into the traces using the directionally conductive material. It can be appreciated that such direct current voltage, when applied for an appropriate time, will reduce the effect of capacitive coupling, loading effect, noise, and/or reduction of the charge or a voltage in a trace due to the size or volume of the trace. In some instances, a direct current voltage may be injected by an injector pixel into a trace by applying a signal or voltage to the trace for a period long enough to allow readout pixels also coupled to the trace to detect the direct current voltage, or a portion of the signal or voltage injected to the trace by the injector pixel. It is contemplated that more than one pixel may be used to inject such a signal or voltage and more than one pixel may be used to detect such a voltage or signal. It is also contemplated that the voltage may be a constant voltage level or it may be a voltage that increases, decreases, or has a specific waveform.

The reduction of capacitive coupling, loading effect, and/or reduction of voltage due to a trace or size or volume may allow the charge or voltage injected into one or more electrodes of an injector pixel to inject a voltage in a trace such that detection of that voltage by injection of the voltage to an electrode of a detector pixel is able to detect a voltage level above the noise level of the detection electronics. Specifically, with respect to FIG. 3, if a 5 volt signal is injected to electrode 152, 5 volts may be the voltage INJ1 at trace 172, and 5 volts may also be the signal detected by pixel 284, which is well above the noise level of pixel 284 (e.g., such as a noise level of 1.8 microvolt). This situation is in contrast to that described above with respect to FIGS. 1, 2A and 2B, in which case, the signal to be detected may drop to 1.8 microvolt, which is below the noise level of the detection electronics (e.g., pixel 284).

Controllers or addressing used to address pixels may also use "group addressing" (e.g., as described above for CON1 and CON2 of FIG. 7) such as addressing of certain groups of injector pixels and detector pixels to provide an image of one or more conductive traces based on the detected charges or voltages injected by the injectors. Specifically, the image of one or more trace may identify defects in the one or more traces according to the image. A map file of such defects or of images without defects may be generated. Where the map of defects, the pixel locations of detector pixels where defects are identified may be determined.

The control and/or addressing processes discussed herein (e.g., of injector and/or detector pixels of testers of FIGS. 1-7) may be performed by hardware components or may be embodied in machine-executable instructions, which may be used to cause a general-purpose or special-purpose processor programmed with the instructions to perform the control and/or addressing. Alternatively, the control and/or addressing may be performed by a combination of hardware and software.

In the foregoing specification, the invention has been described with reference to specific exemplary embodiments thereof. It will, however, be evident that various modifications and changes may be made thereto without departing from the broader spirit and scope of the invention as set forth in the appended claims. The specification and Figures are, accordingly, to be regarded in an illustrative rather than a restrictive sense.

What is claimed is:

1. An apparatus, comprising:
   a conductive material having a first surface and a second surface, the conductive material having a directional electrical conductivity in directions from the second surface to the first surface, and in directions from the first surface to the second surface;
   an injector pixel array having a plurality of injector pixels, each injector pixel coupled to the second surface of the conductive material and having a semiconductor based electronically addressable switch coupled to a driver to inject a charge or a voltage into each injector pixel.

2. The apparatus of claim 1, wherein the switch is an electronically activated switch; and wherein the driver is one of a charge injector, a voltage injector, a pulse addresser, and an excitation pulse generator.

3. The apparatus of claim 1, wherein each injector pixel comprises an electronically addressable thin film transistor (TFT) or an electronically addressable complementary metal oxide semiconductor (CMOS) switch coupled between an injector electrode and a TFT or a CMOS driver amplifier.

4. The apparatus of claim 1, further comprising:
   a detector pixel array having a plurality of detector pixels, each detector pixel coupled to the second surface of the conductive material and having a thin film transistor (TFT) or a complementary metal oxide semiconductor (CMOS) detector capacitor coupled to a TFT or CMOS switch coupled to detect a charge or a voltage at each detector pixel.

5. The apparatus of claim 4, wherein an electrostatic charge corresponding to a voltage injected by a driver through a trace on a printed circuit board (PCB) and electrically coupled to the first surface may be detected from the trace by a detector pixel, wherein the injection pixel is the same pixel as the detector pixel.

6. The apparatus of claim 4, wherein the injector pixels are the same as the detector pixels and the apparatus is an electrostatic imager to test an electronically adressed testing pattern of traces of a PCB by injecting charges or voltages into the traces using the injector pixels and detecting the injected charges or voltages using the detector pixels.

7. The apparatus according to claim 6, further comprising:
   a tri-state enable driver circuit at each pixel to disconnect the driver from the pixel during detection.

8. The apparatus of 6, further comprising:
   a switch to switch between connecting and disconnecting the driver from the pixel.

9. The apparatus of claim 4, wherein an electrostatic charge or a voltage injected by a driver through a first trace on a first side of a printed circuit board (PCB) and electrically coupled to the first surface may be detected by a detector pixel from a second trace on a second side of the PCB coupled to the first trace by at least one conductive via through the PCB.

10. The apparatus of claim 4, wherein the apparatus is a first apparatus, the first surface is electrically coupled to a first trace on a first side of a printed circuit board (PCB) having a conductive via connecting the metal trace to a second trace on a second side of the PCB, and
    further comprising a second apparatus similar to the first apparatus, having a first surface electrically coupled to the second trace to detect a signal injected by the first apparatus.

11. The apparatus of claim 4, wherein the injector pixel array is part of a first device coupled to a controller and the detector pixel array is a part of a different second device coupled to the controller.

12. The apparatus of claim 4, further comprising:
    a controller to apply a plurality of test voltages to an only electronically addressed charge pattern of a plurality of conductive traces of a PCB using a plurality of drivers, and to check an only electronically addressed readout pattern from a plurality of detector pixels at a plurality of locations associated with the conductive traces, wherein the readout pattern comprises a plurality of readout voltages corresponding to the plurality of applied voltages.

13. The apparatus of claim 1, wherein the conductive material is configured to conduct electricity only in directions corresponding to a path between a contact point on the second surface and a contact point on the first surface.

14. The apparatus of claim 1, wherein the conductive material comprises:
   a layer of electrically insulating material having a plurality of disconnected conductive fibers extending from the second surface to the first surface.

15. The apparatus of claim 14, wherein the insulating material is one of silicon and a hardened epoxy, other soft insulating material and the conductive fibers are carbon fibers, metal ferromagnetic fibers, or semiconductor fibers.

16. The apparatus of claim 14, wherein the conductive fibers are electrically coupled to a trace of a PCB disposed over the injector pixel.

17. The apparatus of claim 1, wherein the conductive material comprises:
   a thickness between 10 E-6 meters and 2000 E-6 meters in thickness.

18. An apparatus, comprising:
   a conductive material having a first surface and a second surface, the conductive material having a directional electrical conductivity in directions from the second surface to the first surface, and in directions from the first surface to the second surface;
   an injector pixel array having a plurality of injector pixels, each injector pixel coupled to the second surface of the conductive material and having a semiconductor based switch coupled to a driver to inject a charge or a voltage into each injector pixel, wherein the semiconductor based switch of each injector pixel is part of an electronically addressed pattern.

19. The apparatus of claim 18, wherein the apparatus is an electrostatic imager to test an electronically addressed testing pattern of traces of a PCB by electronically addressing a switch of each injector pixels to form the pattern.

20. The apparatus of claim 18, wherein each injector pixel comprises an electronically addressable thin film transistor (TFT) or an electronically addressable complementary metal oxide semiconductor (CMOS) switch coupled between an injector electrode and a TFT or a CMOS driver amplifier.

21. The apparatus of claim 18, further comprising:
   a detector pixel array having a plurality of detector pixels, each detector pixel coupled to the second surface of the conductive material and having a thin film transistor (TFT) or a complementary metal oxide semiconductor (CMOS) detector capacitor coupled to a TFT or CMOS switch coupled to detect a charge or a voltage at each detector pixel.

* * * * *